United States Patent [19]
Baukus et al.

[11] Patent Number: 6,064,110
[45] Date of Patent: *May 16, 2000

[54] DIGITAL CIRCUIT WITH TRANSISTOR GEOMETRY AND CHANNEL STOPS PROVIDING CAMOUFLAGE AGAINST REVERSE ENGINEERING

[75] Inventors: James P. Baukus, Westlake Village; Lap Wai Chow, South Pasadena; William M. Clark, Jr., Thousand Oaks, all of Calif.

[73] Assignee: Hughes Electronics Corporation, El Segundo, Calif.

[ * ] Notice: This patent is subject to a terminal disclaimer.

[21] Appl. No.: 09/243,855

[22] Filed: Feb. 3, 1999

Related U.S. Application Data

[62] Division of application No. 09/076,012, May 11, 1998, Pat. No. 5,930,663, which is a division of application No. 08/532,326, Sep. 22, 1995, Pat. No. 5,783,846.

[51] Int. Cl.⁷ .................................................. H01L 23/58
[52] U.S. Cl. ........................ 257/652; 257/204; 257/376; 257/400
[58] Field of Search ................................. 257/202, 204, 257/376, 398, 399, 400, 652

[56] References Cited

U.S. PATENT DOCUMENTS

| | | |
|---|---|---|
| 3,946,426 | 3/1976 | Sanders . |
| 4,139,864 | 2/1979 | Schulman . |
| 4,164,461 | 8/1979 | Schilling . |
| 4,267,578 | 5/1981 | Vetter . |
| 4,291,391 | 9/1981 | Chatterjee et al. . |
| 4,295,897 | 10/1981 | Tubbs et al. . |
| 4,314,268 | 2/1982 | Yoshioka . |
| 4,317,273 | 3/1982 | Guterman et al. . |
| 4,374,454 | 2/1983 | Jochems . |
| 4,435,895 | 3/1984 | Parillo . |
| 4,471,376 | 9/1984 | Morcom et al. . |
| 4,581,628 | 4/1986 | Miyauchi et al. . |
| 4,583,011 | 4/1986 | Pechar . |
| 4,603,381 | 7/1986 | Guttag . |
| 4,623,255 | 11/1986 | Suszko . |
| 4,727,493 | 2/1988 | Taylor . |
| 4,766,516 | 8/1988 | Ozdemir et al. . |
| 4,799,096 | 1/1989 | Koeppe . |
| 4,821,085 | 4/1989 | Haken et al. . |
| 4,830,974 | 5/1989 | Chang et al. . |
| 4,975,756 | 12/1990 | Haken et al. . |

(List continued on next page.)

FOREIGN PATENT DOCUMENTS

| | | |
|---|---|---|
| 2486717 | 1/1982 | France . |
| 58-190064 | 4/1982 | Japan . |
| 63-129647 | 6/1988 | Japan . |
| 246762 | 2/1990 | Japan . |
| 02 237038 | 9/1990 | Japan . |
| 4028092 | 1/1992 | Japan . |

OTHER PUBLICATIONS

U.S. application No. 07/278,889, filed Dec. 2, 1988, Crafts.
Frederiksen, Thomas M. "Intuitive CMOS Electronics" McGraw–Hill Publsihing Co. 1989, pp. 134–135.

*Primary Examiner*—J. Carroll
*Attorney, Agent, or Firm*—Bradley K. Lortz; Vijayalakshmi D. Duraiswamy; Michael W. Sales

[57] ABSTRACT

An integrated digital circuit is protected from reverse engineering by fabricating all transistors of like conductivity with a common size and geometric layout, providing a common layout for different logic cells, connecting doped circuit elements of like conductivity with electrically conductive doped implants in the substrate rather than metalized interconnections, and providing non-functional apparent interconnections that are interrupted by non-discernable channel stops so that all cells falsely appear to have a common interconnection scheme. The camouflage is enhanced by providing a uniform pattern of metal leads over the transistor array, with a uniform pattern of heavily doped implant taps from the transistors for connection to the leads; undesired tap-lead connections are blocked by channel stops.

12 Claims, 5 Drawing Sheets

U.S. PATENT DOCUMENTS

| | | |
|---|---|---|
| 5,030,796 | 7/1991 | Swanson . |
| 5,050,123 | 9/1991 | Castro . |
| 5,061,978 | 10/1991 | Mizutani et al. . |
| 5,065,208 | 11/1991 | Shah et al. . |
| 5,068,697 | 11/1991 | Noda et al. . |
| 5,070,378 | 12/1991 | Yamagata . |
| 5,101,121 | 3/1992 | Sourgen . |
| 5,117,276 | 5/1992 | Thomas et al. . |
| 5,132,571 | 7/1992 | McCollum et al. . |
| 5,138,197 | 8/1992 | Kuwana . |
| 5,146,117 | 9/1992 | Larson . |
| 5,168,340 | 12/1992 | Nishimura . |
| 5,202,591 | 4/1993 | Walden . |
| 5,227,649 | 7/1993 | Chapman . |
| 5,231,299 | 7/1993 | Ning et al. . |
| 5,302,539 | 4/1994 | Haken et al. . |
| 5,308,682 | 5/1994 | Morikawa . |
| 5,309,015 | 5/1994 | Kuwata et al. . |
| 5,336,624 | 8/1994 | Walden . |
| 5,354,704 | 10/1994 | Yang et al. . |
| 5,369,299 | 11/1994 | Byrne . |
| 5,371,390 | 12/1994 | Mohsen . |
| 5,376,577 | 12/1994 | Roberts et al. . |
| 5,384,472 | 1/1995 | Yin . |
| 5,399,441 | 3/1995 | Bearinger et al. . |
| 5,441,902 | 8/1995 | Hsieh et al. . |
| 5,468,990 | 11/1995 | Daum . |
| 5,475,251 | 12/1995 | Kuo et al. . |
| 5,539,224 | 7/1996 | Ema . |
| 5,721,150 | 2/1998 | Pasch . |
| 5,783,846 | 7/1998 | Baukus et al. ............ 257/204 |
| 5,866,933 | 2/1999 | Baukus et al. ............ 257/368- |

DIGITAL CIRCUIT WITH TRANSISTOR GEOMETRY AND CHANNEL STOPS PROVIDING CAMOUFLAGE AGAINST REVERSE ENGINEERING

RELATED APPLICATIONS

This is a division of application Ser. No. 09/076,012 filed on May 11,1998 U.S. Pat. No. 5,930,663, which is a divisional application of parent application Ser. No. 08/532, 326 filed on Sep. 22, 1995 and issued on Jul. 21, 1998 as U.S. Pat. No. 5,783,846. This application is related to application Ser. No. 08/191,063, filed Feb. 3, 1994.

BACKGROUND OF THE INVENTION

1. Field of the Invention

This invention relates to the prevention of reverse engineering of integrated circuits (ICs), and more particularly to security techniques in which a common geometric design is established for different circuit cells and interconnections between circuit elements are made undetectable.

2. Description of the Related Art

Several techniques have been used to reverse engineer ICs. Electron (e)-beam probing with a scanning electron microscope (SEM), either through SEM photographs or voltage contrast analysis, is a standard reverse engineering mechanism, although secondary ion mass spectrometry (SIMS), spreading resistance analysis and various other techniques have also been used. A general description of e-beam probing is provided in Lee, "Engineering a Device for Electron-beam Probing:, *IEEE Design & Test of Computers*, 1989, pages 36–49.

Numerous ways to frustrate unwanted attempts to reverse engineer an IC have also been developed. For example, in U.S. Pat. No. 4,766,516 to Ozdemir et al. (assigned to Hughes Aircraft Company, the assignee of the present invention), additional circuit elements that do not contribute toward the desired circuit function are added to an IC, and disguised with the visible appearance of being an ordinary part of the IC. The elements have physical modifications that are not readily visible but cause them to function in a different manner, inhibiting the proper functioning of the IC in case of an attempted copying or other unauthorized use. When the apparent function rather than the actual function of the disguised elements are copied, the resulting circuit will not operate properly.

In U.S. Pat. No. 4,583,011 to Pechar a pseudo-MOS (metal oxide semiconductor) device is given a depletion implant that is not readily visible to a copier, who would infer from the device's location in the circuit that it would be enhancement-mode. A somewhat related approach is taken in French patent publication no. 2 486 717 by Bassett et al., published Jan. 15, 1982; the circuit doping is controlled so that some devices which appear to be transistors actually function as either open or short circuits. And in U.S. Pat. No. 4,603,381 to Guttag the memory of a central processing unit is programmed by the doping of its channel regions, rather than by the presence or absence of gates, to protect permanently programmed software.

Instead of disguising circuit elements, some systems have a mechanism to protect the circuit from operating until a correct access code has been entered. Such systems are described in U.S. Pat. No. 4,139,864 to Schulman and U.S. Pat. No. 4,267,578 to Vetter.

Each of the above protection schemes requires additional processing and/or uses additional circuitry that is dedicated to security and does not contribute to the basic functioning of the circuit. This increases the cost of circuit production and complicates the circuitry.

U.S. Pat. No. 4,799,096 to Koeppe uses doped implants to connect the sources and drains of different transistors to improve circuit reliability and testability, but the circuit function can be determined from the transistor arrangement. U.S. Pat. No. 5,138,197 to Kuwana connects different transistors in an address decoder array with doped implants, but circuit functions can be determined from clearly visible elements such as gate electrodes and circuit interconnects. Japanese patent publication 58-190064 to Sawase provides a metalization over a diffused source to block light from the source/substrate junction and thus reduce leakage current. While this tends to camouflage the source, the nature of the circuit can still be determined from its visible elements.

SUMMARY OF THE INVENTION

The present invention seeks to provide a camouflaged digital IC, and a fabrication method for the IC, that is very difficult to reverse engineer, can be implemented without any additional fabrication steps and is compatible with computer aided design (CAD) systems that allow many different kinds of logic circuits to be constructed with ease.

To achieve these goals, the size and internal geometry of the transistors within each of the cells are made the same for the same transistor type, different logic cells have their transistors arranged in substantially the same spatial pattern so that the logic functions are not discernable from the transistor patterns, and the transistors are collectively arranged in a uniform array on the substrate so that boundaries between different logic cells are similarly not discernable.

Electrically conductive, heavily doped implant interconnections that are difficult for a reverse engineer to detect provide interconnections among the transistors within each cell, with the pattern of interconnections determining the cell's logic function. A uniform pattern of interconnections among all of the transistors on the substrate is preferably provided, with different logic functions implemented by interrupting some of the interconnections to make them apparent (they appear to be conductive connections but are actually non-conductive) by the addition of opposite conductivity channel stop implants. The channel stops are substantially shorter than the interconnections which they interrupt, preferably with a dimension equal approximately to the minimum feature size of the IC. To the extent the interconnections could be discerned by a reverse engineer, they would all look the same because the channel stops would not be detected, thus enhancing the circuit camouflage.

Reverse engineering is further inhibited by providing a uniform pattern of metal leads over the transistor array. A uniform pattern of heavily doped implant taps are made to the various transistors to connect with the leads. Some of the taps are made apparent by blocking them with channel stops similar to those employed in the apparent inter-transistor connections. A reverse engineer will thus be unable to either determine boundaries between different cells, or to identify different cell types, from either the metalization or the tap patterns. The metalization is preferably implemented in multiple layers, with the upper layers shading connections between a lower layer and the underlying IC.

A camouflaged circuit is preferably fabricated by implanting the interconnections and the portions of the transistors which have the same conductivity at the same time, and also implanting the channel stops and the portions of the transistors which have the same conductivity as the channel stops at the same time.

Further features and advantages of the invention will be apparent to those skilled in the art from the following detailed description, taken together with the accompanying drawings.

DETAILED DESCRIPTION OF THE INVENTION

The invention camouflages digital logic cells bar arranging all of the transistors for each of the cells in a uniform "sea" of transistors in which the boundaries between different cells are not apparent, by arranging the transistors within different cells that have the same number of transistors but different logic functions in the same geometric layout so that the cell functions cannot be determined by the transistor geometries, by using implants that are made electrically conductive by heavy doping and are not readily discernable for intracell connections, and by providing the same geometric layout of intracell interconnections for different logic cells so that the cell functions cannot be determined even if the interconnections are determined by a reverse engineer. A uniform pattern of interconnections is achieved by providing implants for all potential interconnections within each cell, and disabling unwanted interconnections for a given cell with narrow implanted channel stops of opposite conductivity. Since the channel stops are even more difficult to discern than are the implanted interconnections, a still higher level of protection is provided. Heavily doped implants with a common geometric layout and channel stop interruptions can also be used for intercell as well as intracell connections.

Reverse engineers typically attempt to recognize transistor patterns and interconnections that correspond to different logic cells, and then try to identify similar patterns throughout the logic array. This saves the effort of having to investigate each transistor individually. Interconnections between cells are determined by photographing the metalization layers and superimposing them on the cells. The use of repetitive cell patterns greatly simplifies the reverse engineer's task. For example, for an array of 100,000 cells that employs 100 different types of cells, the reverse engineer only has to identify 100 different cell types. The present invention forces a reverse engineer to investigate each individual transistor within each cell, and even then the overall circuit is extremely difficult to reconstruct.

An important aspect of the invention is that it does not rely upon modifications or additions to the functioning of the circuitry that is to be protected from reverse engineering, nor does it require any additional processing steps or equipment. Instead, a highly effective deterrent to reverse engineering is accomplished in a streamlined manner that adds neither processing, time nor complexity to the basic circuitry.

Implementations of the invention in the form of OR an AND gates will first be described. Using these and other common gates as building blocks, many different types of logic circuitry can be designed. A distinct advantage of the invention is that different types of logic circuits may be made to look alike, thus confusing a potential reverse engineer.

Figure 1:
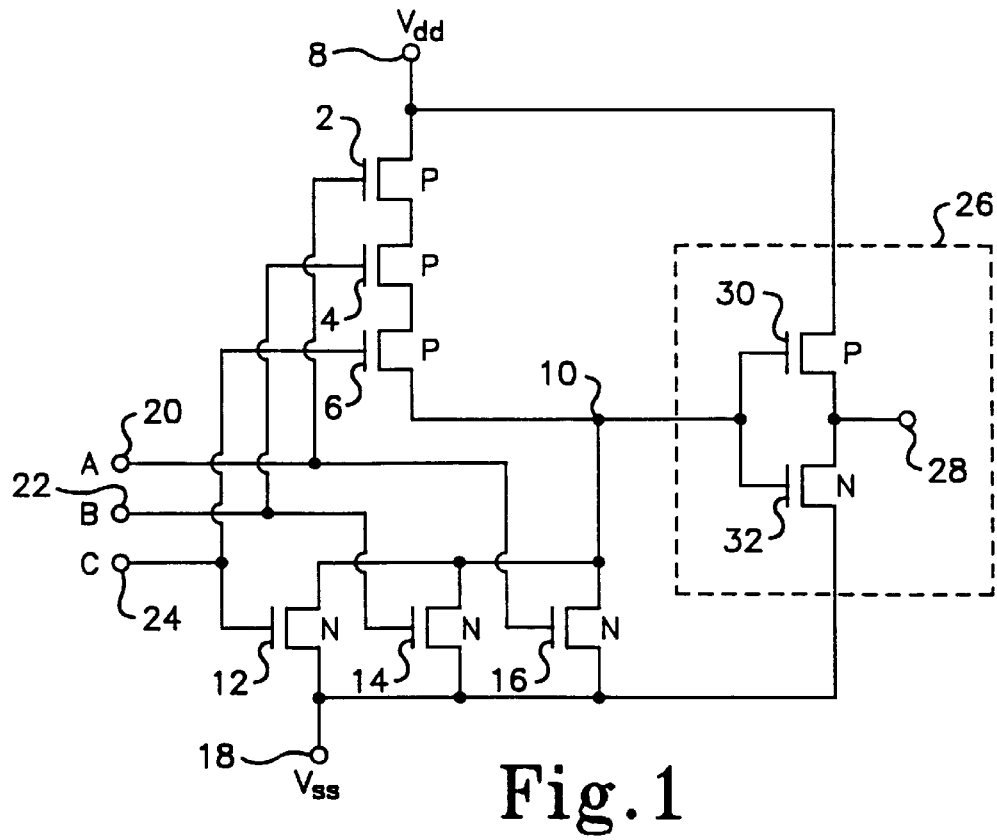
FIGS. 1 and 2 are schematic diagrams of 3-input OR and AND gates.

FIG. 1 is a schematic diagram of a conventional three-input OR gate circuit, in which three p-channel transistors 2, 4 and 6 are connected in series between a positive voltage terminal 8 and an inverted output 10, and three n-channel transistors 12, 14 and 16 are connected in parallel between a negative voltage terminal 18 (which can be designated ground) and the inverted output 10. Input terminals 20, 22 and 24 for the inputs designated A, B and C are connected to the gates of respective p-channel/n-channel transistor pairs.

The signal at inverted output 10 represents a NOR function. To convert this to an OR output, an inverter 26 inverts the signal at output 10 to produce an OR output at terminal 28. The inverter is conventional, consisting of a p-channel transistor 30 and an n-channel transistor 32 that are connected in series between the positive and negative voltage terminals 8 and 18, with the gates of transistors 30 and 32 receiving an input from inverted output 10 and output terminal 28 tapped from the series junction of 30 and 32.

Figure 2:
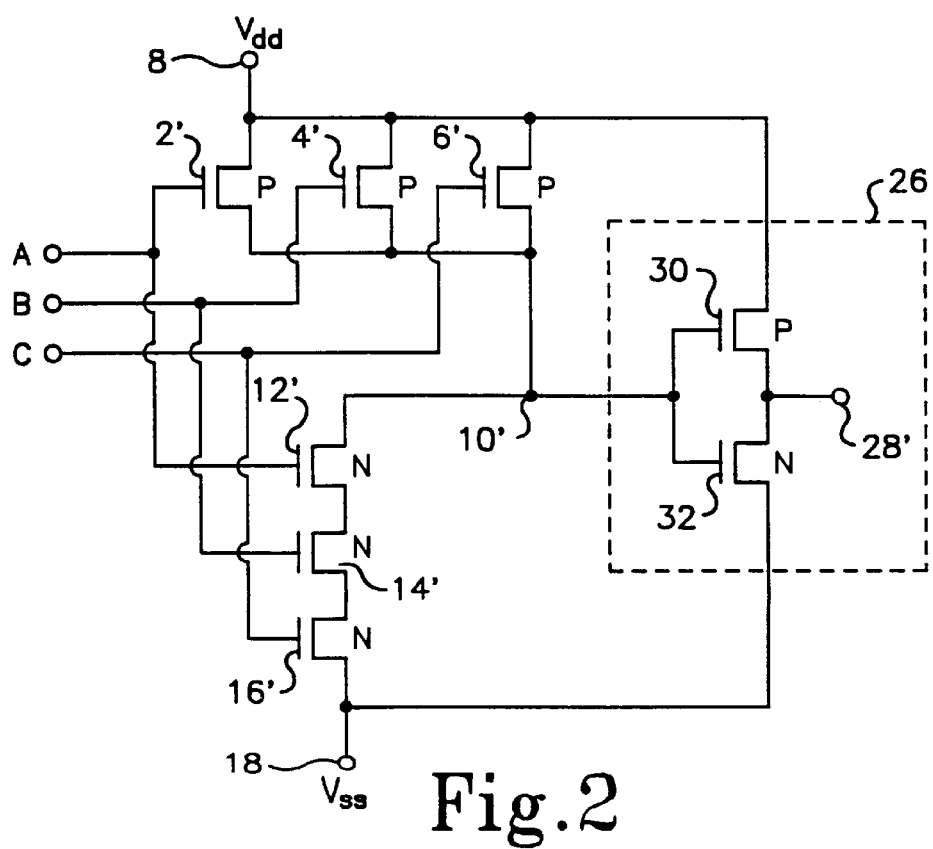

A conventional three-input AND gate is illustrated in FIG. 2. It is similar to the OR gate of FIG. 1, but for the AND gate the three p-channel transistors 2', 4' and 6' are connected in parallel, and the three n-channel transistors 12', 14' and 16' are connected in series. Again, an inverted function (NAND) is produced at an inverted output 10', and inverted to yield the desired AND signal at the final output terminal 28'.

Figure 3A:
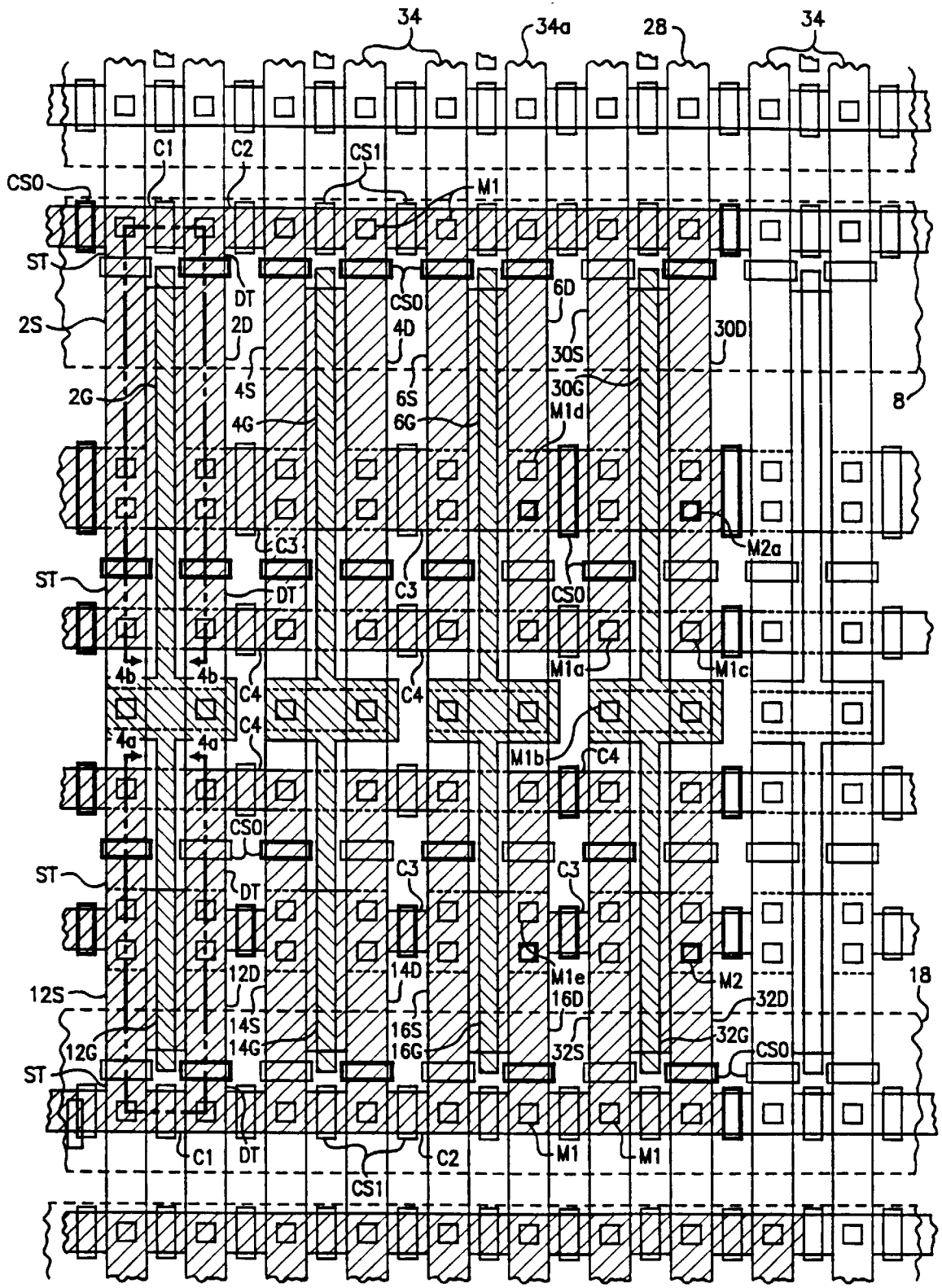
FIGS. 3a and 3b are plan views emphasizing different levels of a camouflaged integrated circuit in accordance with the invention, showing an implementation of the FIG. 1 NOR gate.
Figure 3B:
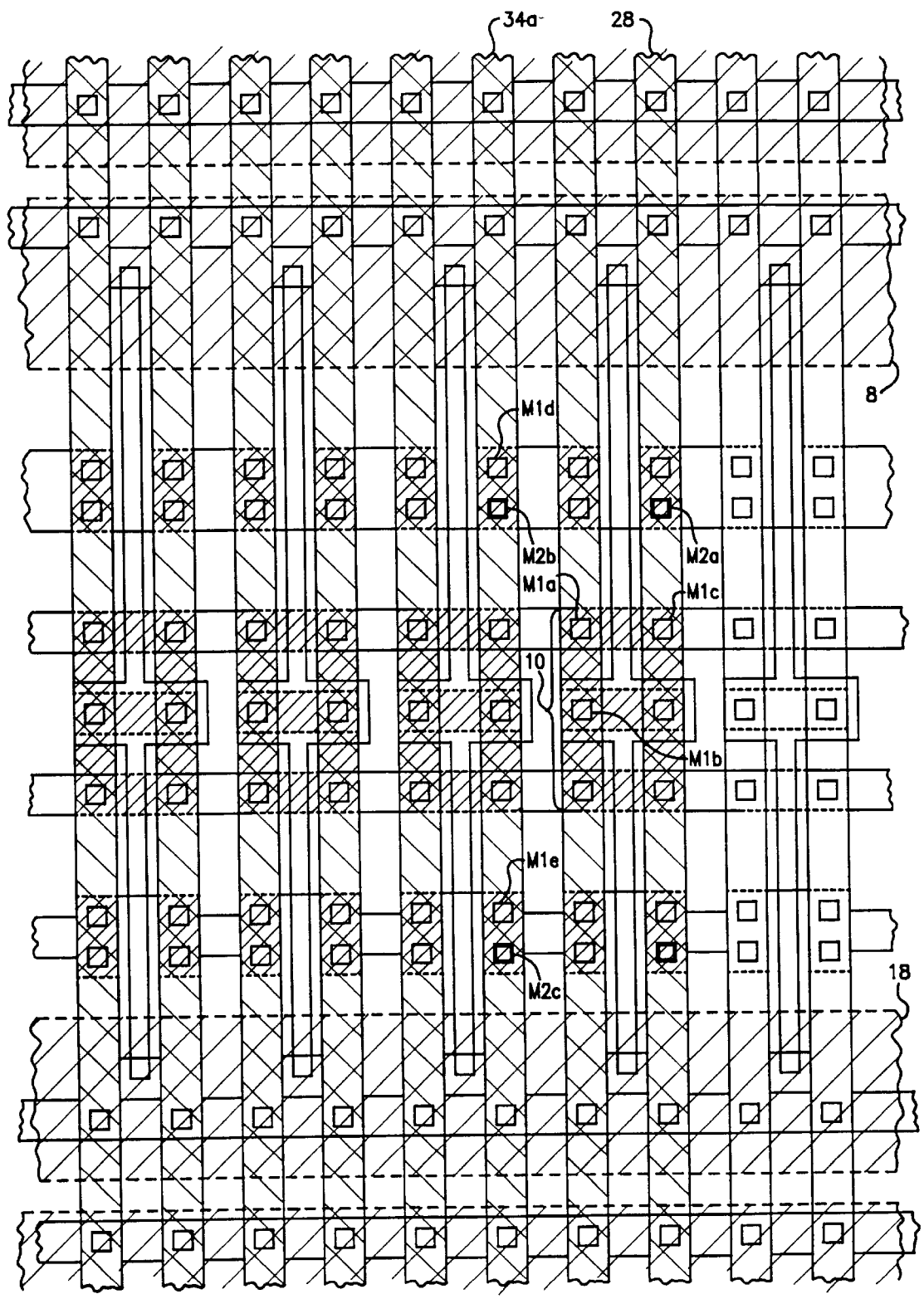

An implementation of the OR gate of FIG. 1 in accordance with the invention is shown in FIGS. 3a and 3b. Both are plan views of the same area in a logic array, with FIG. 3a emphasizing the transistor drain, source and interconnection implants by shading them from lower left to upper right (polysilicon gates are shaded from upper left to lower right), and FIG. 3b emphasizing the metalization that overlies the IC substrate. In FIG. 3b the lower level of metalization (metal-1) which directly contacts the underlying IC is shaded from lower left to upper right, while the upper metal-2 metalization that interconnects different portions of the metal-1 is shaded from upper left to lower right. Metal-1 is shown in dashed lines and metal-2 in solid but unshaded lines in FIG. 3a. Contact connections between the IC and the metal-1 layer are indicated by hollow squares M1, while vertical conductive vias which substitute connections between the metal-1 and metal-2 layers for the IC-metal-1 contacts are stipled and labeled M2.

In FIG. 3a the sources, drains and gates of each of the transistors are indicated by the same transistor numbers as in FIG. 1, followed by S, D or G, respectively. The transistor sources and drains (the designation of an element as a source or a drain is somewhat arbitrary) are fabricated in a conventional manner by implanting dopant ions into the circuit substrate. While both the p+ and n+ doping can vary with parameters such as feature size and the type of fabrication process used, the p+ sources and drains of the p-channel devices 2, 4, 6 and 30 are typically doped with a boron ion implant at a density of about $4 \times 10^{15}$ ion/cm$^2$, and an implantation energy of about 30 keV. The n+ source and drain regions of the n-channel transistors 12, 14, 16 and 32 are typically doped in accordance with industry standards with arsenic ions at a density of about $5 \times 10^{15}/cm^2$, and an implant energy of about 150 keV Either a masked ion flood beam or a focused ion beam may be used; doping by older gaseous diffusion techniques may also be employed.

In FIG. 3a the transistors used in the OR gate of FIG. 1 are shaded for clarity, while the remaining transistors are unshaded. All of the p-channel transistors in the entire array have substantially the same sizes and geometric layouts; the n-channel transistors similarly have the same size and geometric layout. This is of considerable benefit in camouflaging the cell to which a particular transistor belongs, and also the boundaries between cells, since normally different cell transistors of the same conductivity type will not all have the same size. For example, output transistors are normally larger because they carry more current. This can be accommodated by the invention by making all of the transistors somewhat larger, although at the price of a greater overall area and consequently some degradation in the device density. Alternately, buffer circuits could be employed to boost the output currents if the output transistors are reduced to the size of the other transistors, or the ratio of the source/drain width W (in the vertical direction in FIG. 3a) to the gate length L (the narrow horizontal gate dimension in FIG. 3a) can be increased. The W/L ratio is conventionally about 7–15 for an n-channel device, and about 15–30 for p-channel device. This ratio can be increased on the order of about 15% to accommodate the invention. Another consequence of using equal size transistors is that the circuit's operating speed can go down somewhat because of extra parasitic capacitances, although the transistors can be used in parallel to obtain more output drive. Since the camouflaged cells tend to be larger and slower than conventional cells, it may be desirable to implement only the more important portion of a complete circuit on a single die with the invention's camouflage techniques, with the remainder of the circuit implemented using conventional cells.

The use of identical transistor geometries and layouts by itself is very helpful in thwarting reverse engineering. However, the camouflage provided by the invention is considerably enhanced by a transistor interconnection scheme that greatly adds to the difficulty of reverse engineering. Rather than connecting the transistor regions of like conductivity with metalized interconnects in the conventional fashion, such connections are made by means of doping implants into the substrate between the desired sources and drains. Such interconnections are preferably implemented, as shown in FIG. 3a, by extending the source and drain implants on either side of the transistors with taps that are labeled ST for source taps and DT for drain taps, and by connectors C that interconnect the source and drain taps for the same transistor and the sources and drains of adjacent transistors. The implanted interconnections are preferably established simultaneously with the source and drain implants by providing appropriate openings in the implantation mask (if flood beam implantation is employed), or by extending the scanning area of a focused ion beam. An alternate method of implantation would be a conventional gaseous diffusion process to establish the doping, but this is less preferable than ion beams. By using the same source/drain fabrication step to also fabricate the implanted interconnections, the interconnections have the same dopant concentration as the sources and drains and are formed integrally therewith.

A uniform pattern of interconnections is provided for the transistors of each cell; the pattern includes all of the interconnections that could be used for any of the different cells in the overall IC. Thus, both intra- and intertransistor connectors C1 and C2, respectively, are implanted at the opposite extremities of the source and drain taps ST and DT, intertransistor connectors C3 are provided between the inner ends of the sources and drains of adjacent transistors, and intertransistor connectors C4 are provided between the inner extremities of the source and drain taps ST and DT of adjacent transistors.

As described thus far, there is no differentiation between logic cells because they all have the same complete set of intra- and intertransistor connections. The circuit at this point, while nonfunctional, is thus virtually impossible to reverse engineer. Logic functionality is established by interrupting selected taps and connectors with channel stop implants, with the remaining uninterrupted taps and connectors determining the cell functionality. The channel stops are of opposite conductivity to the interconnections which they respectively interrupt, and are preferably implanted in the same fabrication step as the other portions of the circuit that have the same conductivity as the channel stop.

The channel stops are preferably made as small as possible, consistent with providing a secure interruption of the interconnections in which they are located. This will generally be the minimum feature size of the IC, which with present generally available technology is 0.5 microns. If the channel stops were confined to the widths of the interconnections which they interrupt and had upper surfaces planar with these interconnections, they would be totally invisible to presently available reverse engineering techniques. On the other hand, the channel stops will normally extend slightly beyond the limits of their respective interconnections to assure a reliable interruption. Also, since n+ and p+ doping normally exhibit different etch rates, the surface of the IC from one side of a channel stop to the opposite side will normally not be absolutely planar. However, the preferred channel stop dimension of about 0.5 microns approximates the wavelength of visible light, which would make the channel stops invisible to observation in this wavelength regime. Furthermore, with a very narrow channel stop the normal lateral spreading of the faster n+ etching would tend to reduce or even entirely eliminate the surface differential that would otherwise accompany the different etch rates, making reverse engineering even more difficult.

Referring again to FIG. 3a, the channel stops CS0 that are implanted to implement the OR gate are stipled, while potential channel stop sites CS1 that are not used for this particular logic cell, leaving their respective interconnects uninterrupted, are shown in outline only. The correspondence between FIGS. 1 and 3a is readily apparent. The metal-1 lead 8 provides a Vdd power input in FIG. 3a, while the metal-1 lead 18 provides a Vss (ground) source. The series connection from Vdd 8 through p-channel transistors 2, 4 and 6 to the NOR output terminal 10 extends from the M1 lead 8 to the upper end of the source tap ST for the source 2S of transistor 2 and through an unblocked channel stop site to 2S; from the lower end of 2D through a connector C3 to 4S; from the lower end of 4D through another connector C3 to the lower end of 6S; through an unblocked channel stop site at the lower end of 6D and another unblocked channel stop site in a connector C4 to a blocked tap at the lower end of 30S; and up through a contact M1a in the blocked tap to a metal-1 link which serves as the NOR output node 10 (shown in FIG. 3b).

The inverter transistors 30 and 32 are shown on the right side of the shaded area of FIG. 3a. The gate input to p-channel transistor 30 from NOR output node 10 is through the metal-1 contact M1b, while the OR output 28 is taken from the metal-1 contact M1c at the tap from the lower end of 30D, and up through the via M2a to the metal-2 line 28 (shown in FIG. 3b). The connection from the NOR output 10 to the n-channel transistors 12, 14 and 16 extends from the lower end of 6D, through a contact M1d to the metal-1 layer; a via M2b that is linked by metal-1 to M1d and extends up to a metal-2 line 34a; and down 34a and through another via M2c to a metal-1 link which connects it to a metal-1 contact M1e at the upper end of 16D. The pattern of unblocked and blocked channel stop sites in the n-channel portion of the cell establishes the parallel connection of n-channel transistors 12, 14 and 16, with a connection of 12S to ground line 18 through an unblocked metal-1 contact from a tap ST at the lower end of 12S.

The rows of p-channel and n-channel transistors extend in a horizontal direction over the full extent of the IC transistor array, without any visibly discernable distinctions between the transistors of the same conductivity within a given cell or among different cells. Similarly, the vertical columns of alternating p-channel and n-channel transistors extend over the full IC transistor array, again with all of the p-channel transistors in each column having the same size and geometric layout, and the same for all the n-channel transistors.

The OR cell illustrated in FIGS. 3a and 3b is shown with channel stops that isolate it from adjacent logic cells to both the left and right. Interconnections with such cells can be made if desired by metal-1 connections and/or eliminating selected channel stops. Interconnections between different logic cells within a vertical column would normally be made through the metal-2 leads.

The AND gate shown in FIG. 2 would be implemented in a manner similar to FIGS. 3a and 3b, but the connections for the p-channel and n-channel transistors would be reversed from those shown in FIGS. 3a and 3b. Many other cells with varying numbers of n-channel/p-channel transistor pairs could be stored in a library for use with a CAD system. In addition to the 3-input NOR and NAND gates and the 2-transistor inverters described above, such cells could include NOR and NAND gates with different numbers of inputs, exclusive or (XOR) gates, all with or without output inverters, multiplexers, various types of flip-flops and combinations of different logic functions.

Another important feature that enhances the camouflage effect is that, as shown in FIGS. 3a and 3b, the metalization patterns are uniform and repetitive. The dimensions of and spacings between metallizations is uniform whenever possible. This is contrary to conventional circuit layouts, in which non-uniform spacings are used to minimize parasitic capacitances. While this aspect of the invention can degrade performance somewhat, particularly because it can conflict with an optimal geometric positioning of the Vdd and ground lines to minimize parasitic capacitances, the reduction in operating speed is more than offset by the enhanced camouflage effect for high security applications. Again, the uniform pattern makes it much more difficult to discern cell boundaries and functions. Additional camouflage protection is afforded by locating the M1 metal-1/IC contacts so that they are shaded and obscured by overlying metal-2 leads as shown, and by the metal-2 leads shading the metal-1/metal-2 vias M2; both of these shading effects are shown in FIG. 3b. Furthermore, metal lines are preferably run all the way across each cell in their path, rather than terminating at a target location within a cell such as the gate contact.

The polysilicon gates (assuming a silicon substrate is used) can be formed either before or after the source, drain, interconnect and channel stop implants. The metal-1 and metal-2 connectors and their respective contacts and vias are of course formed over the completed IC.

Figure 4A:
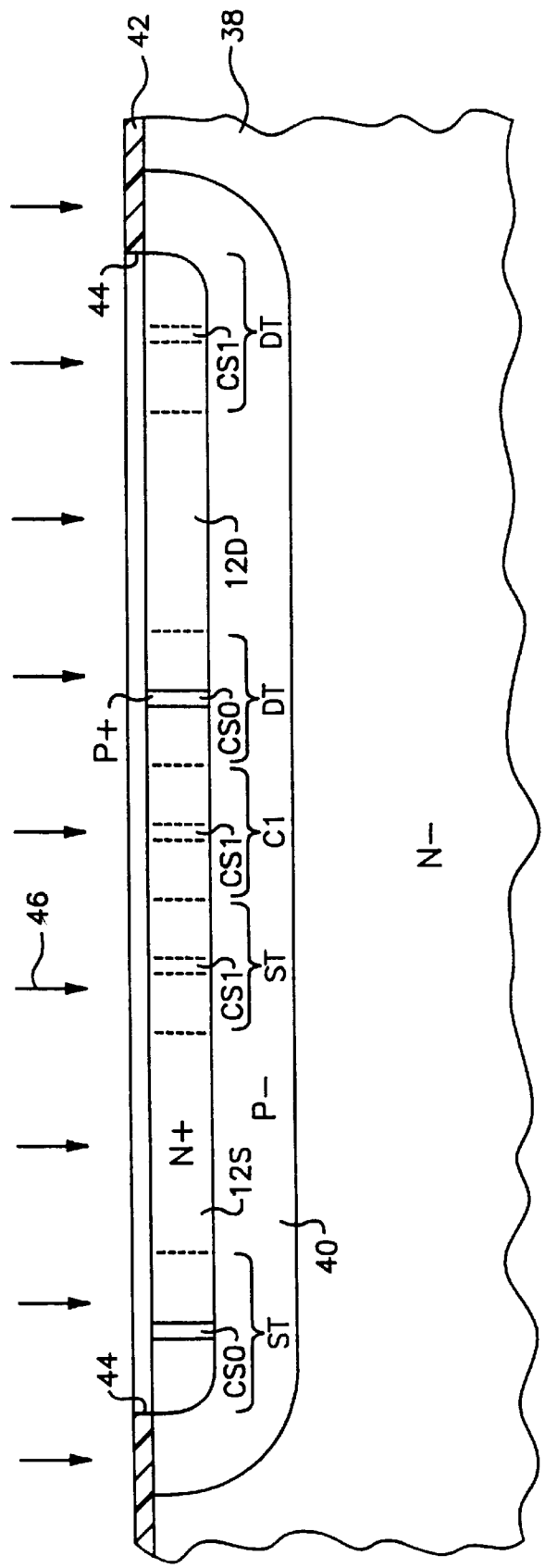
FIGS. 4a and 4b are sectional views taken along section lines 4a—4a and 4b—4b of FIG. 3a that illustrate the fabrication of transistor source/drain regions and associated implanted interconnects, including channel stops which make some of the interconnects apparent rather than functional.
Figure 4B:
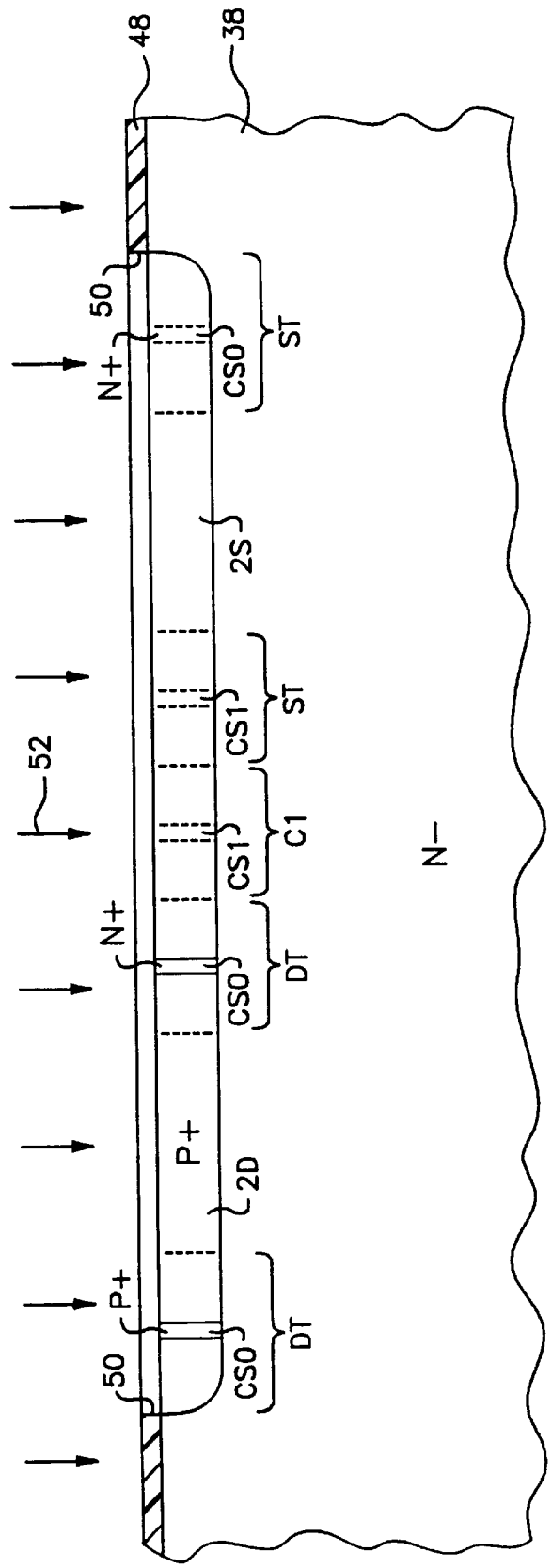

FIGS. 4a and 4b are sectional views (not to scale) taken along the section lines 4a—4a and 4b—4b of FIG;. 3a, illustrating the fabrication of their respective source, drain, interconnection and channel stop implants, but excluding the polysilicon and metalization layers. The devices are formed in a semiconductor substrate 38 that for illustrative purposes is silicon, but may also be GaAs, some other desired semiconductor material, or in principle any nonconductive material such as silicon-on-sapphire. The circuit fabrication can be accomplished with a conventional process, such as that described in Frederiksen, *Intuitive CMOS Electronics*, McGraw-Hill Publishing Co., 1989, pages 134–145; it is a distinct advantage of the invention that it does not require any special processing to implement.

In a typical CMOS process, a protective oxide layer about 250 Angstroms thick is first laid down over the semiconductor substrate 38. A well is then implanted through openings in the oxide layer for each FET whose source and drain is of the same conductivity type as the substrate doping. With substrate 38 illustrated as having an n-doping, a somewhat more heavily doped p-well 40 would be implanted about 3 microns deep for the n-channel devices (FIG. 4a). The wells are then subjected to a long high temperature anneal, typically at about 1,150° C., for about 10 hours.

The next step is the FET source, drain and interconnection implants. For the n-channel devices an oxide mask 42 is laid down over the substrate with openings at the desired locations for the sources and drains. In the case of an n-channel FET 12 whose source 12S and drain 12D may be interconnected by means of an ion implantation in accordance with the invention, a single continuous mask opening 44 is provided to implant the drain 12D, the source 12S, the outer and inner source and drain taps ST and DT, and the connector C1. The implantation is then performed, preferably with a flood beam (indicated by numeral 46) of suitable n-dopant ions such as arsenic. The unused channel stop sites CS1 are left with the same doping conductivity as their respective taps and connectors, while the active channel stops CSO are implanted to the opposite conductivity. This can be done by providing a mask over the CSO sites during the implantation of the source and drain and implanting the channel stops during the implantation of the p-channel transistors, or by implanting the channel stops n+ along with the rest of the n-channel transistors and then (or previously) performing a double-dose p+ implant that is restricted to the channel stops.

As in conventional processing, a separate implant mask 48 is used for the p-channel devices (FIG. 4b). A single continuous opening 50 is provided in the mask for the taps and connectors and the transistor elements which they connect; these are illustrated as p-channel FET source 2S, drain 2D, drain taps DT, source taps ST and connector C1. Implantation is preferably performed with a flood beam, indicated by numeral 52, of a suitable p-type dopant such as boron.

The implantation can be performed in the same manner as prior unsecured processes, the only difference being that the implant is now done through a larger opening in each mask that includes the implanted taps and connectors as well as the FET sources and drains, but excludes the channel stops. No differences in processing time or techniques are required, and the operator need not even know that the mask provides for circuit security. The circuits are then completed in a conventional manner, with threshold implants made into the FET channels to set the transistor characteristics. A field oxide is laid down as usual, and polysilicon is then deposited and doped either by diffusion or ion implantation to form the channels and the interconnects. A dielectric is next deposited and metalization layers added to establish inputs, outputs, bias line and any necessary cell linkages. Finally, an overglass or other suitable dielectric coating is laid down over the entire chip.

Since the only required change in the fabrication process need be for a modification in the openings of the ion implantation masks, a new set of standard masks with the modified openings could be provided and used as standard elements of the circuit design process. This makes the invention particularly suitable for CAD systems, with the designer simply selecting a desired secure logic gate design from a library of such gates.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A camouflaged circuit, comprising:
    a substrate;
    an IC associated with said substrate, said IC comprising a plurality of logic cells each comprising a plurality of transistors and fabricated by:
        providing an IC substrate;
        forming in said IC substrate said plurality of transistors in at least two of said logic cells as an array of transistors so that the boundaries between adjacent said logic cells are not apparent;
        forming common patterns of electrically conductive doped intertransistor interconnections so that there is no visible differentiation between said logic cells; and
        interrupting at least one of said interconnections with a channel stop of opposite conductivity to said at least one interconnection, said channel stop being configured so that said at least one interconnection is indistinguishable from interconnections which are not interrupted.

2. The camouflaged circuit of claim 1, wherein at least two of said array of transistors have the same number of transistors and have the same geometric layout.

3. The camouflaged circuit of claim 1, further comprising: electrically conductive dopant implants to make intracell interconnections within at least two of said logic cells having different logic functions, said intracell interconnections having the same geometric layout for said at least two of said logic cells.

4. The camouflaged circuit of claim 1 wherein at least one transistor in at least two of said logic cells are of a first type and at least another transistor in said at least two of said logic cells are of a second type, said transistors of said first type having substantially same sizes and geometric layouts, and said transistors of said second type having substantially same sizes and geometric layouts.

5. A camouflaged circuit, comprising:
    a substrate;
    an IC associated with said substrate, said IC comprising a plurality of logic cells each comprising a plurality of transistors and fabricated by:
        providing an IC substrate; and
        forming in said IC substrate said plurality of transistors in at least two of said logic cells as an array of transistors so that the boundaries between adjacent said logic cells are not apparent,
        forming common patterns of electrically conductive doped intratransistor and intertransistor interconnections so that there is no visible differentiation between said logic cells, and
        interrupting at least one of said interconnections with a channel stop of opposite conductivity to said at least one interconnection, said channel stop being configured so that said at least one interconnection is indistinguishable from interconnections which are not interrupted.

6. The camouflaged circuit of claim 5 wherein said channel stop has substantially the same width as said at least one interconnection and has an upper surface which is planar with said at least one interconnection.

7. The camouflaged circuit of claim 1 further including uniform and repetitive metallization patterns on said IC.

8. The camouflaged circuit of claim 1, wherein the step of forming comprises implantation.

9. The camouflaged circuit of claim 1, wherein the step of forming comprises doping by gaseous diffusion.

10. A camouflaged circuit, comprising:
    a substrate;
    an IC associated with said substrate, said IC comprising multiple logic cells and fabricated by:
        providing an IC substrate;
        forming transistors in each of said logic cells as an array of transistors so that the boundaries between adjacent said logic cells are not apparent, at least two of said array of transistors having the same number of transistors and the same geometric layout;
        forming common patterns of electrically conductive doped intra-transistor and intertransistor interconnections so that there is no visible differentiation between said logic cells, and
        interrupting at least one of said interconnections with a channel stop of opposite conductivity to said at least one interconnection, said channel stop being configured so that said at least one interconnection is indistinguishable from interconnections which are not interrupted.

11. The camouflaged circuit of claim 10 wherein at least one transistor in at least two of said logic cells are of a first type and at least another transistor in said at least two of said logic cells are of a second type, said transistors of said first type having substantially same sizes and geometric layouts, and said transistors of said second type having substantially same sizes and geometric layouts.

12. A camouflaged circuit, comprising:
    an IC comprising:
        a plurality of logic cells in an IC substrate, at least one of said logic cells having a logical function which is different from the logical function of at least another one of said logic cells, each of said logic cells having a plurality of transistors, said plurality of transistors for each of said logic cells being positioned as arrays of transistors so that the boundaries between adjacent cells are not apparent and so that said arrays which have the same number of transistors have the same geometric layout;
        common patterns of electrically conductive doped intertransistor interconnections so that there is no visible differentiation between said logic cells, and
        a channel stop of opposite conductivity to at least one of said interconnections, interrupting said at least one interconnection said channel stop being configured so that said at least one interconnection is indistinguishable from interconnections which are not interrupted; and
    a substrate associated with said IC.

* * * * *